(12) United States Patent
Miki et al.

(10) Patent No.: US 9,299,628 B2
(45) Date of Patent: Mar. 29, 2016

(54) POWER SEMICONDUCTOR MODULE (75) Inventors: Takayoshi Miki, Tokyo (JP); Yasushi Nakayama, Tokyo (JP); Takeshi Oi, Tokyo (JP); Kazuhiro Tada, Tokyo (JP); Shiori Idaka, Tokyo (JP); Shigeru Hasegawa, Tokyo (JP); Tomohiro Kobayashi, Tokyo (JP); Yukio Nakashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/131,581

(22) PCT Filed: Jul. 5, 2012

(86) PCT No.: PCT/JP2012/004356
§ 371 (c)(1),
(2), (4) Date: Jan. 29, 2014

(87) PCT Pub. No.: WO2013/008424
PCT Pub. Date: Jan. 17, 2013

(65) Prior Publication Data
US 2014/0138707 A1 May 22, 2014

(30) Foreign Application Priority Data
Jul. 11, 2011 (JP) .................. 2011-153020

(51) Int. Cl.
*H01L 23/28* (2006.01)
*H01L 25/18* (2006.01)
(Continued)

(52) U.S. Cl.
CPC ............ *H01L 23/28* (2013.01); *H01L 23/3121* (2013.01); *H01L 23/3135* (2013.01);
(Continued)

(58) Field of Classification Search
CPC .................................................. H01L 23/3135
See application file for complete search history.

(56) References Cited

U.S. PATENT DOCUMENTS

2004/0007772 A1 1/2004 Arai et al.
2004/0188706 A1 9/2004 Chang et al.
(Continued)

FOREIGN PATENT DOCUMENTS

JP 2-34352 U 3/1990
JP 3 126055 12/1991
(Continued)

OTHER PUBLICATIONS

Extended European Search Report issued Feb. 18, 2015 in Patent Application No. 12810615.0.
(Continued)

*Primary Examiner* — Kyoung Lee
*Assistant Examiner* — Ratisha Mehta
(74) *Attorney, Agent, or Firm* — Oblon, McClelland, Maier & Neustadt, L.L.P.

(57) ABSTRACT

A power semiconductor module is provided which is capable of keeping low the degrees of increases in temperatures of wide bandgap semiconductor elements, reducing the degree of increase in chip's total surface area of the wide bandgap semiconductor elements, and being fabricated at low costs, when Si semiconductor elements and the wide bandgap semiconductor elements are placed within one and the same power semiconductor module. The Si semiconductor elements are placed in a central region of the power semiconductor module, and the wide bandgap semiconductor elements are placed on opposite sides relative to the central region or in edge regions surrounding the central region.

20 Claims, 6 Drawing Sheets (51) Int. Cl.
*H01L 25/07* (2006.01)
*H01L 23/31* (2006.01)
*H01L 23/373* (2006.01)
*H01L 23/36* (2006.01)

(52) U.S. Cl.
CPC .......... *H01L23/3735* (2013.01); *H01L 25/072* (2013.01); *H01L 25/18* (2013.01); *H01L 23/36* (2013.01); H01L 2224/48227 (2013.01); H01L 2224/49111 (2013.01); H01L 2224/49175 (2013.01); H01L 2924/12032 (2013.01); H01L 2924/1305 (2013.01); H01L 2924/13055 (2013.01); H01L 2924/13091 (2013.01)

(56) References Cited

U.S. PATENT DOCUMENTS

| | | | | |
|---|---|---|---|---|
| 2007/0152309 | A1* | 7/2007 | Cheng | 257/676 |
| 2009/0168471 | A1 | 7/2009 | Tsugawa et al. | |
| 2010/0244092 | A1 | 9/2010 | Ishikawa et al. | |
| 2011/0049535 | A1* | 3/2011 | Soeno | 257/77 |
| 2011/0062491 | A1* | 3/2011 | Nakata | 257/146 |
| 2012/0104583 | A1* | 5/2012 | Lee et al. | 257/676 |
| 2012/0286292 | A1 | 11/2012 | Nakayama et al. | |
| 2013/0214328 | A1 | 8/2013 | Ishikawa et al. | |

FOREIGN PATENT DOCUMENTS

| | | |
|---|---|---|
| JP | 09 186287 | 7/1997 |
| JP | 11 274482 | 10/1999 |
| JP | 2000 340896 | 12/2000 |
| JP | 2000-353777 A | 12/2000 |
| JP | 2001-245479 A | 9/2001 |
| JP | 2004 095670 | 3/2004 |
| JP | 2006-303306 A | 11/2006 |
| JP | 2008 060430 | 3/2008 |
| JP | 2009-159184 A | 7/2009 |
| JP | 2009 272482 | 11/2009 |
| JP | 2010 040569 | 2/2010 |
| JP | 2010 124607 | 6/2010 |
| JP | 2010 232576 | 10/2010 |
| WO | 2011 086896 | 7/2011 |

OTHER PUBLICATIONS

Notification of Reasons for Refusal issued Jul. 14, 2015 in Japanese Patent Application No. 2013-523812 (with English language translation).
Office Action issued Sep. 24, 2014 in Japanese Patent Application No. 2013-523812 (with English language translation).
International Search Report Issued Sep. 4, 2012 in PCT/JP12/004356 Filed Jul. 5, 2012.

* cited by examiner

POWER SEMICONDUCTOR MODULE

TECHNICAL FIELD

The present invention relates to power semiconductor modules having built-in switching elements and diode elements connected in anti-parallel with the switching elements.

BACKGROUND ART

A power semiconductor module, having built-in switching elements and diode elements connected in anti-parallel with the switching elements, is widely employed in devices, such as power converters that perform DC-AC and DC-DC conversions. Silicon (Si) semiconductors are conventionally used for switching elements and diode elements; however, in recent times, product development is underway to use wide bandgap semiconductors, typified by silicon carbide (SiC) semiconductors. As compared to the Si semiconductors, the SiC semiconductors have features such as being low-loss and operable at high temperatures and having high dielectric withstand voltage. Using the SiC semiconductors allows reduction in size and loss of a power semiconductor module, and further allows reduction in size of a radiator that is attached to the power semiconductor module and increase in efficiency of a power converter that uses the power semiconductor module.

Using the SiC semiconductors for both switching elements and diode elements increases the above advantageous effects; however, because the switching elements have complex structures as compared to the diode elements, the use of the SiC semiconductors for the switching elements leads to the creation of a fabrication problem. For this reason, a semiconductor module has been proposed in which Si semiconductors are used for switching elements, while SiC semiconductors are used for diode elements alone, and the Si switching elements and the SiC diode elements are placed above one and the same baseplate (refer to Patent Document 1, for example).

RELATED ART DOCUMENT

Patent Document

Patent Document 1
JP-A-2004-95670 (pages 10 and 11, and FIG. 8)

SUMMARY OF THE INVENTION

Problem that the Invention is to Solve

As compared to Si semiconductors, SiC semiconductors have features such as being low-loss and operable at high temperatures and having high dielectric withstand voltage. In recent times, research and development of the SiC semiconductor fabrication technique is still growing, albeit making steady progress. In terms of the Si semiconductors that have already been widely used and whose research and development has been actively underway, switching element chips and diode element chips of a large surface area of over 10 milli-meters square are under mass production at low costs suited for commercial applications. On the other hand, in terms of the SiC semiconductors, switching element and diode element chips of a large surface area of over 10 milli-meters square have low yields and thus, are high in costs and unsuitable for mass production. Because of this, when the Si switching elements and the SiC diode elements are placed within one and the same power semiconductor module, the chip's total surface area of the diode elements needs to be made small as compared to that of the switching elements, and thermally appropriate chip placement and a module structure need to be designed after consideration of design conditions that the current density of the SiC semiconductor is increased.

In the conventional semiconductor module disclosed in Patent Document 1, Si switching elements and SiC diode elements are placed on the left and right sides, respectively. Although the Si switching elements and the SiC diode elements are separately placed on different electrically insulative substrates, thermal interference from the switching elements increases temperatures of the diode elements placed in a central region of the power semiconductor module. For this reason, there is a need for reducing heat generation from the SiC diode elements and for increasing their radiation capabilities, by increasing the number of SiC diode elements paralleled and their chip sizes. As a result, however, a problem has been that the chip's total surface area of the SiC diode elements increases, thereby resulting in high-cost fabrication of the power semiconductor module.

The present invention is directed to overcome the above problem, and to provide a power semiconductor module that is capable of reducing the degree of increase of the chip's total surface area of diode elements made up of wide bandgap semiconductors and that can be fabricated at low costs, when the switching elements made up of the Si semiconductors and the diode elements made up of the wide bandgap semiconductors are placed within one and the same power semiconductor module.

Means for Solving the Problems

A power semiconductor module according to the present invention includes Si semiconductor elements and wide bandgap semiconductor elements. The Si semiconductor elements are placed in a central region of the power semiconductor module, and the wide bandgap semiconductor elements are placed on opposite sides relative to the central region thereof or in edge regions surrounding the central region thereof, the Si semiconductor element and the wide bandgap semiconductor element being placed on one and the same plane.

Advantageous Effects

A power semiconductor module according to the present invention includes Si semiconductor elements and wide bandgap semiconductor elements. The Si semiconductor elements are placed at a central region of the power semiconductor element, and the wide bandgap semiconductor elements are placed on opposite sides relative to the central region thereof or in edge regions surrounding the central region thereof, the Si semiconductor element and the wide bandgap semiconductor element being placed on one and the same plane; therefore, the degrees of increases in temperatures of the wide bandgap semiconductor elements can be kept low and the degree of increase in chip's total surface area thereof can be reduced, which allows for low-cost fabrication.

MODE FOR CARRYING OUT THE INVENTION

Embodiment 1

Figure 1:
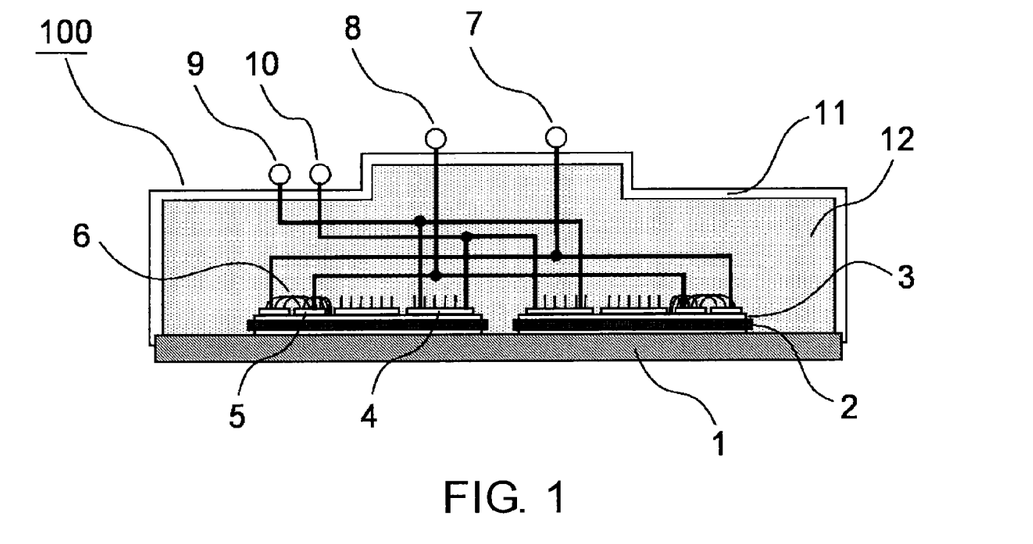
FIG. 1 is a cross-sectional view of a power semiconductor module according to Embodiment 1 of the present invention.

FIG. 1 is a cross-sectional view of a power semiconductor module according to Embodiment 1 for embodying the present invention, and is a simplified diagram showing a cross section of the power semiconductor module. Referring FIG. 1, the power semiconductor module 100 includes a baseplate 1, electrically insulative substrates 2, conductor patterns 3, Si switching elements 4 made up of Si semiconductors, SiC diode elements 5 made up of SiC semiconductors, which are wide bandgap semiconductors, bond wires 6, main electrodes 7, 8, control terminals 9, 10, a housing 11, an electrically insulative encapsulant material 12, and the like. The Si switching elements 4 are the Si semiconductors, and the SiC diode elements 5 are the wide bandgap semiconductor elements.

The baseplate 1 is used for attaching the power semiconductor module 100 onto an external radiator. The radiator, not shown, is externally attached to one surface (on the lower side in FIG. 1) of the baseplate 1. Heat generated within the module 100 is externally radiated via the baseplate 1. The electrically insulative substrates 2 are placed by soldering or a similar action on the other surface (on the upper side in FIG. 1) of the baseplate 1. One surface of each of the insulative substrates 2—the lower side in FIG. 1—is a surface to be attached to the baseplate 1, while the conductor patterns 3 serving as current paths are formed on the other surface thereof—the upper side in FIG. 1.

The Si switching elements 4 and the SiC diode elements 5 are mounted on the conductor patterns 3. It will generally suffice if the switching elements 4 are semiconductor elements that allow for on/off control. For example, devices such as insulated gate bipolar transistors (IGBTs) or metal-oxide-semiconductor field-effect transistors (MOSFETs) are employed. Further, devices such as, for example, Schottky diodes or P-intrinsic-N (PiN) diodes are used as the diode elements 5.

The switching elements 4 and the diode elements 5 are electrically connected in anti-parallel with each other. For example, when the IGBTs are employed as the switching elements 4, collectors of the IGBTs and cathodes of the SiC diode elements are electrically connected together via the conductor patterns 3. The bond wires 6 are provided to the switching elements 4 and the diode semiconductor elements 5. Such elements are electrically connected via the conductor patterns 3 and the bond wires 6 to the main electrodes 7, 8 and the control terminals 9, 10. The main electrodes 7, 8, which are connected to an external circuit, not shown, constitute a main circuit of a device such as a power converter. Control signals that provide on/off control of the switching elements 4 are provided from the external circuit to the control terminals 9, 10. Note that in order for FIG. 1 to show an easy-to-understand internal placement of the power semiconductor module, the main electrodes 7, 8 and the control terminals 9, 10 are simplified for illustration.

Components constituting the power semiconductor module 100, such as the Si switching elements 4 and the SiC diode elements 5, are accommodated within the housing 11. And in order to maintain insulation within the module 100, the housing 11 is filled with the electrically insulative encapsulant material 12.

Figure 2:
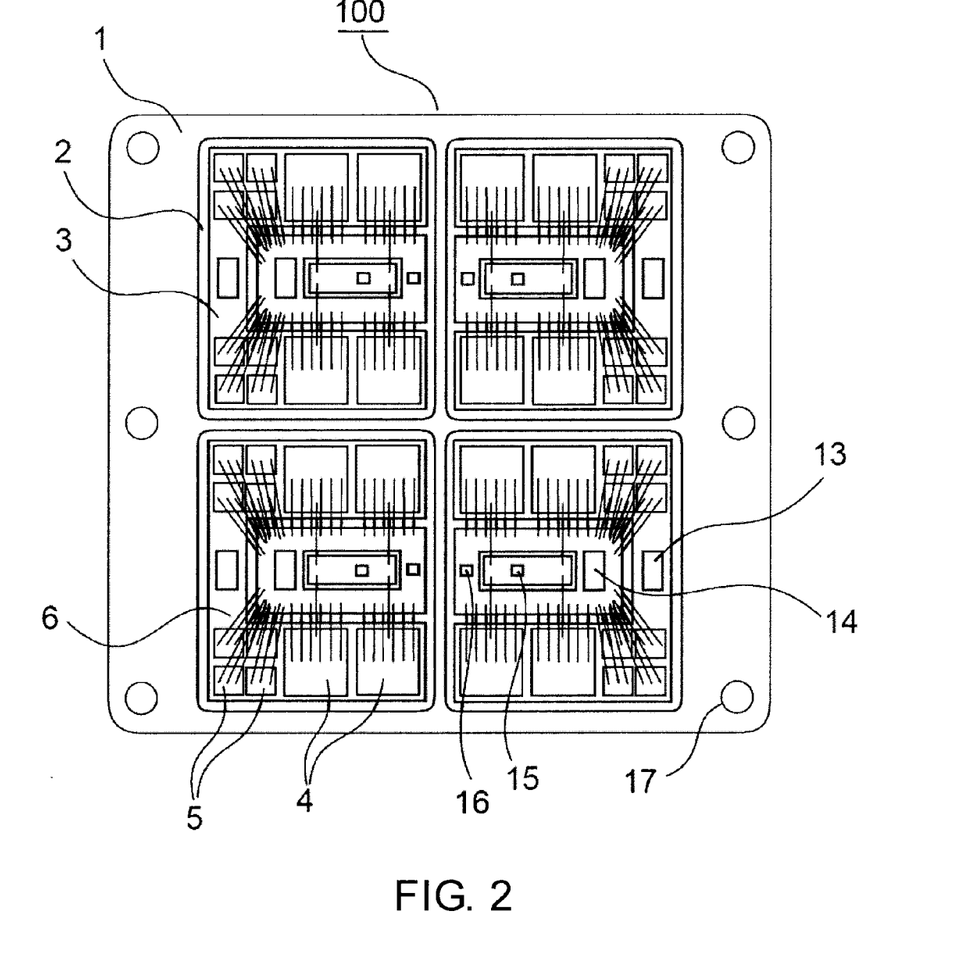
FIG. 2 is a top view showing internal placement of the power semiconductor module according to Embodiment 1 of the present invention.

FIG. 2 is a top view showing internal placement of the module 100 as viewed from above, with the main electrodes 7, 8, the control terminals 9, 10, the housing 11 and the insulative encapsulant material 12 removed from what is shown in FIG. 1. In FIG. 2, components with the same reference numerals as those in FIG. 1 represent the same or corresponding ones. This applies throughout the descriptions of the specification.

The main electrode 7 shown in FIG. 1 is coupled to main electrode connecting positions 13 on the conductor patterns 3. The main electrode 8 and the control terminals 9, 10 are coupled to main electrode connecting positions 14 and control terminal connecting positions 15, 16, respectively. And they are electrically connected via the conductor patterns 3 and the bond wires 6 to the Si switching elements 4 and the SiC diode elements 5. Further, the baseplate 1 is provided with mounting holes 17, which are used to attach the module 100 to a device such as the external radiator.

The plural Si switching elements 4 and the plural SiC diode elements 5 (in FIG. 2, sixteen switching elements 4, and thirty-two diode elements 5) are placed on the module 100. Referring to FIG. 2, the plural switching elements 4 are placed as a group in a central region of the module 100. The central region in the present embodiment refers to a belt zone that separates the module 100 vertically into two sides, as viewed from above. The plural SiC diode elements 5 are separately placed in the opposite regions relative to the central region (placed on both sides of the module 100). In other words, the switching elements 4 are placed so as to be between the plural diode elements 5. One example is that in FIG. 2, a separate group of the sixteen diode elements 5 is placed on each of both sides of the module 100, and the sixteen switching elements 4 are placed between the two groups thereof.

In general, when many semiconductor elements, such as switching elements and diode elements, are mounted within one and the same power semiconductor module, even if each semiconductor element has the same loss, heat is difficult to radiate externally from the semiconductor elements mounted in the central region of the power semiconductor module, so that temperatures of the elements are easy to increase. On the other hand, heat is easy to radiate externally from the semiconductor elements mounted on the both sides of the module or in edge regions thereof, so that the temperatures of such elements are difficult to increase. For example, when SiC diode elements are mounted in the central region of the module, the temperatures of the diode elements are easy to increase. For this reason, a problem is that although increasing the number of SiC diode elements paralleled and their chip sizes would conceivably cause heat generation from the diode elements to be reduced and heat radiation capabilities of the elements to be increased, the increase in chip's total surface area of the diode elements leads to high fabrication costs of the module.

However, in the present embodiment, because the SiC diode elements 5 are placed on the opposite sides relative to the central region and thus the heat generated is easy to radiate as compared to that in the central region and the degree of increase in temperature is thereby reduced, heat generation from the diode elements 5 does not need to be reduced by increasing the number of diode elements 5 paralleled and their chip sizes. On the other hand, the Si switching elements 4 are to be placed in the central region whose temperature is easy to increase; however, the degrees of increases in temperatures of the switching elements 4 can be reduced by increasing the number of switching elements 4 paralleled and their chip sizes. The switching elements 4 can be fabricated at low costs as compared to the diode elements 5; thus, even if the chip total surface area of the switching elements 4 is increased, the degree of increase of the chip's total surface area of the diode elements 5 can be reduced, thereby allowing the power semiconductor modules to be fabricated at low costs.

Here, the feature of the diode elements 5 is that they can be used at high temperatures, and it is conceivable that they are used at the high temperatures with them placed in the central region whose temperature is easy to increase; however, their high temperature use has the following adverse effect. That is, the spread of high temperature heat causes increases in temperatures of components, such as the switching elements 4, present in the neighborhoods of the diode elements 5 and components in the neighborhoods of the power semiconductor module, thus leading to potential reduction in reliability in thermal cycling. Even if the diode elements 5 are used in the same temperature range as that of the switching elements 4, such a use can make good use of the features of the diode elements 5, such as being low-loss and having high dielectric withstand voltage. In addition, components in the neighborhood of diode elements, such as an electrically insulative encapsulant material and solder—the components usable in the same temperature range as that of the switching elements 4—can also be used, resulting in no loss of reliability in thermal cycling. Further, in a range that presents no problem with the adverse influence caused by the above high temperature use, the diode elements 5 can be used at high temperatures. By applying the concept of the present invention to that case as well, if the diode elements 5 are placed on the opposite sides relative to the central region, the degree of increase of the chip's total surface area of the diode elements 5 can be reduced, achieving low-cost fabrication of the power semiconductor module.

Incidentally, the power semiconductor module 100 according to the present invention has plural groups of the Si switching elements 4 and the SiC diode elements 5 placed above the same baseplate 1 and on each of the same electrically insulative substrates 2. When Si switching elements and SiC diode elements are separately disposed on different electrically insulative substrates and above different baseplates, an advantage is that the influence of thermal interference can be reduced. In some cases, however, operation conditions that increase losses of the switching elements differ from those that increase losses of the diode elements. For example, when a power semiconductor module is used as an inverter for motor drive, a motoring operation in which energy is supplied from an inverter side to an electric motor side has an increased loss of a switching element due to a long energization period of the switching element as compared to a diode element, while a regenerative operation in which energy is supplied from the electric motor side to the inverter side has an increased loss of the diode element due to a long energization period of the diode element as compared to the switching element.

For this reason, in the operation conditions where the losses of the SiC diode elements 5 are great as compared to those of the Si switching elements 4, the influence of the thermal interference caused by the switching elements 4 is small, allowing heat generated from the diode elements 5 to be radiated using entire portions of the electrically insulative substrates 2 and the baseplate 1. Accordingly, placing the switching elements 4 and diode elements 5 above the same baseplate 1 and on each of the same insulative substrates 2 further increases the entire radiation capability of the module 100. Another advantage is that placing the switching elements 4 and diode elements 5 above the same baseplate 1 and on each of the same insulative substrates 2 further reduces component counts, thus facilitating wiring.

The chip placement of the module according to the present embodiment represents one example. It will generally suffice if the switching elements 4 are placed in the central region of the module 100, and the diode elements 5 are placed on opposite sides relative to the central region; thus, there are no particular limitations to the placement and the like of other components constituting the module 100. It will generally suffice if interconnections between, for example, each of the main electrodes 7, 8 and the diode elements 5 and between, for example, each of the control electrodes 9, 10 and the switching elements 4, are made electrically. Bond wires may be directly connected to the main electrodes 7, 8, or without using the bond wires, bus bars may be employed to provide wiring. In such a case, there is a possibility of modifications of the placement of the switching elements 4 and the diode elements 5 within the module 100; however, it will generally suffice if the switching elements 4 are placed in the central region of the module 100 and the diode elements 5 are placed on opposite sides relative to the central region thereof.

As described above, the Si switching elements 4 made up of the Si semiconductors are placed in the central region—whose temperature is easy to increase of the power semiconductor module 100, and the SiC diode elements 5 made up of the SiC semiconductors, which are wide bandgap semiconductors, are placed on both sides—whose temperatures are difficult to increase—of the module 100; thus, the radiation capabilities of the diode elements 5 can be increased to reduce the degree of increase in the chip's total surface area of the diode elements 5 that are higher in fabrication costs than the switching elements 4, thereby providing the module 100 capable of being fabricated at low costs.

Further, in a power semiconductor module built-in to a power converter handling large current, the chip sizes of semiconductor elements or the number of elements paralleled need to be increased according to an amount of the large current handled by this converter; therefore, the probability of including a defective chip(s) in a semiconductor wafer(s) is assumed to increase, thus reducing the yield during fabrication. Because the reduction of the yield during fabrication leads to an increase in fabrication costs, there is a need for a power converter having a power semiconductor module built in, the module having its semiconductor elements of small size chips and having a small number of elements paralleled. In particular, wafers for wide bandgap semiconductor elements are more defective than those for Si semiconductor elements, and the decrease rates of the former's yields are greater than those of the Si semiconductor elements; therefore, even for the wide bandgap semiconductor elements having a relatively high heat-resistant temperature, reduction of their chip sizes leads to increase of the amount of heat generation per unit chip surface area. In the present embodiment, however, the Si switching elements 4 made up of the Si semiconductors are placed in the central region—whose temperature is easy to increase—of the power semiconductor module 100, and the SiC diode elements 5 made up of the SiC semiconductors, which are the wide bandgap semiconductors, are placed on the opposite sides—whose temperatures are difficult to increase—relative to the module 100; thus, the heat radiation of the diode elements 5 can be increased to thereby reduce the chip sizes of the wide bandgap semiconductor elements.

The present embodiment has described an example in which the Si switching elements 4 are placed in the central region of the power semiconductor module 100, and the SiC diode elements 5 are placed on the opposite sides relative to the module 100. However, SiC switching elements made up of SiC semiconductors, and Si diode elements made up of Si semiconductors may be used to place the Si diode elements in the central region of the power semiconductor module, and to place the SiC switching elements on the opposite sides relative to the module. In this case, according to the placement of the SiC switching elements and the Si diode elements, their conductor patterns, bond wires, main electrodes, control terminals and the like are also placed appropriately. In this way, the Si diode elements are placed in a central region—whose temperature is easy to increase—of the power semiconductor module, and the SiC switching elements, on both sides—whose temperatures are difficult to increase—of the module; therefore, even if the chip's total surface areas of the diode elements increase the degree of increase of the chip's total surface area of the switching elements that are higher in fabrication costs than the diode elements can be reduced, thus providing the power semiconductor module capable of being fabricated at low costs.

Embodiment 2

Figure 3:
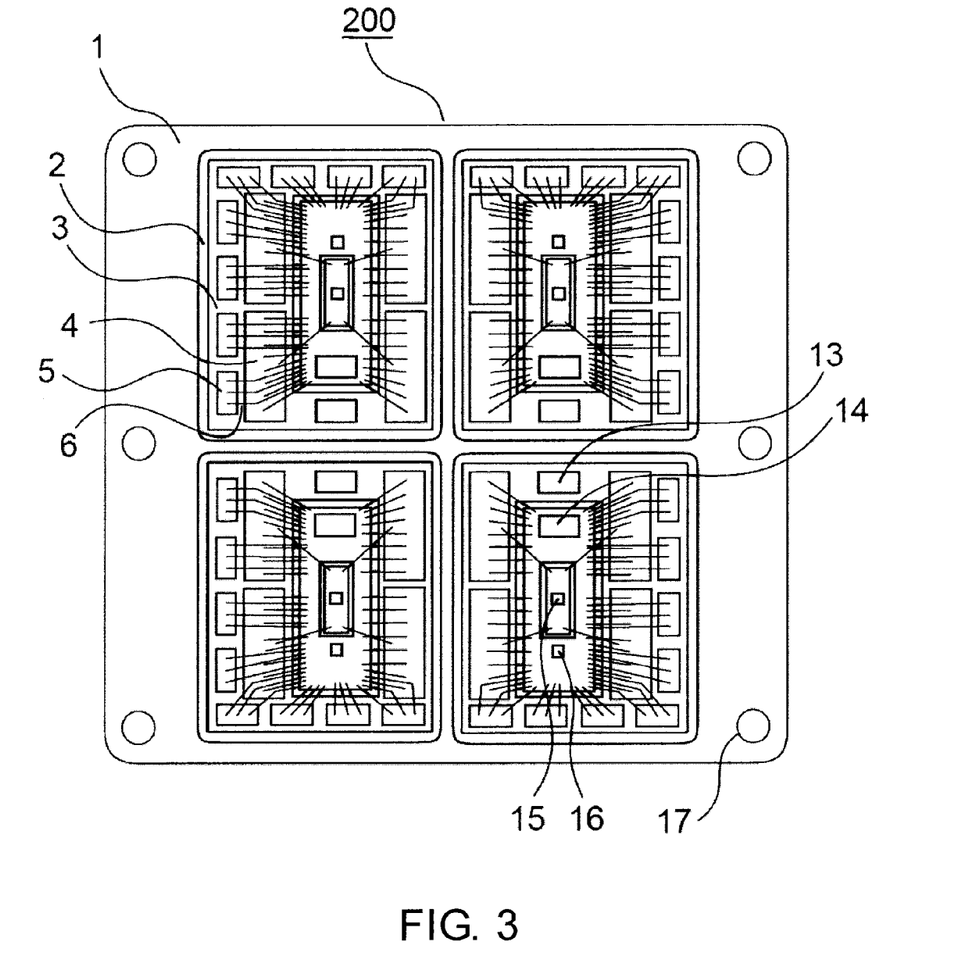
FIG. 3 is a top view showing internal placement of a power semiconductor module according to Embodiment 2 of the present invention.

FIG. 3 is a top view showing internal placement of a power semiconductor module according to Embodiment 2 for embodying this invention. The present figure is a view of the a power semiconductor module 200 as viewed from above, with the main electrodes, the control terminals, the housing and the insulative encapsulant material removed as with FIG. 2. In Embodiment 1, the Si switching elements 4 are placed in the central region of the power semiconductor module 100, and the SiC diode elements 5, on the opposite sides relative to the central region thereof, however, the difference between the present embodiment and Embodiment 1 is that, in the present embodiment, the diode elements 5 are placed in edge regions surrounding the central region—placed in the edge regions of the power semiconductor module 200.

The plural Si switching elements 4 and the plural SiC diode elements 5 (in FIG. 3, sixteen switching elements 4 and thirty-two diode elements 5) are placed in the module 200. Referring to FIG. 3, the plural switching elements 4 are placed as a group in the central region of the module 200. The central region in the present embodiment refers to a non-edge region of the module 200 as viewed from above. The plural diode elements 5 are placed in the edge regions surrounding this central region. In other words, the switching elements 4 are placed in the central region of the module 200 so as to be surrounded by the SiC diodes elements 5. One example is that, in FIG. 3, the thirty-two diodes elements 5 are placed so as to form the edge regions, and the sixteen switching elements 4 are placed so as to be surrounded by the thirty-two diode elements 5. Note that the bond wires 6, the conductor patterns 3 and the like have been altered with changing placement of the switching elements 4 and the diode elements 5.

In the present embodiment, the diode elements 5 are placed in the edge regions, surrounding the central region, of the module 200, thus providing better heat radiation of the diode elements 5 than the chip placement in Embodiment 1 and thereby reducing the degrees of increases in temperatures of the diode elements 5. Note that although the feature of the diode elements 5 is that they can be used at high temperatures, they are not necessarily used at the high temperatures, but may be employed in the same temperature range as that of the switching elements 4.

The chip placement of the module according to the present embodiment represents one example. It will generally suffice if the switching elements 4 are placed in the central region of the module 200 and the diode elements 5 are placed in edge regions surrounding the central region thereof; thus, as with Embodiment 1, there are no particular limitations to the placement and the like of other components constituting the module 200. It will generally suffice if interconnections between, for example, each of the main electrodes 7, 8 and the diode elements 5 and between, for example, each of the control electrodes 9, 10 and the switching elements 4, are made electrically. Bond wires may be directly connected to the main electrodes 7, 8, or without using the bond wires, bus bars may be employed to provide wiring. In such a case, although there is a possibility of modifications of the placement of the switching elements 4 and the diode elements 5 within the module 200, it will generally suffice if the switching elements 4 are placed in the central region of the module 200 and the diode elements 5 are placed on edge regions surrounding the central region thereof.

As described above, the Si switching elements 4 made up of the Si semiconductors are placed in the central region—whose temperature is easy to increase—of the power semiconductor module 200, and the SiC diode elements 5 made up of the SiC semiconductors, which are wide bandgap semiconductors, are placed in the edge regions—whose temperatures are difficult to increase—of the module 200; thus, even if the chip's total surface areas of the switching elements 4 increase, the degree of increase of the chip's total surface area of the diode elements 5 that are higher in fabrication costs than the switching elements 4 can be reduced, thus providing the module 200 capable of being fabricated at low costs.

The present embodiment has described an example in which the Si switching elements 4 are placed in the central region of the module 200, and the SiC diode elements 5 are placed in the edge regions of the module 200. However, the SiC switching elements made up of the SiC semiconductors, and the Si diode elements made up of the Si semiconductors may be used to place the Si diode elements in the central region of the power semiconductor module, and to place the SiC switching elements in the edge regions of the module. In this case, according to the placement of the SiC switching elements and the Si diode elements, their conductor patterns, bond wires, main electrodes, control terminals and the like are also placed appropriately. In this way, the Si diode elements are placed in the central region—whose temperature is easy to increase—of the power semiconductor module, and the SiC switching elements, in edge regions—whose temperatures are difficult to increase—of the module; therefore, even if the degree of increase of the chip's total surface area of the diode elements can be reduced, thus providing the power semiconductor module capable of being fabricated at low costs.

Embodiment 3

Figure 4:
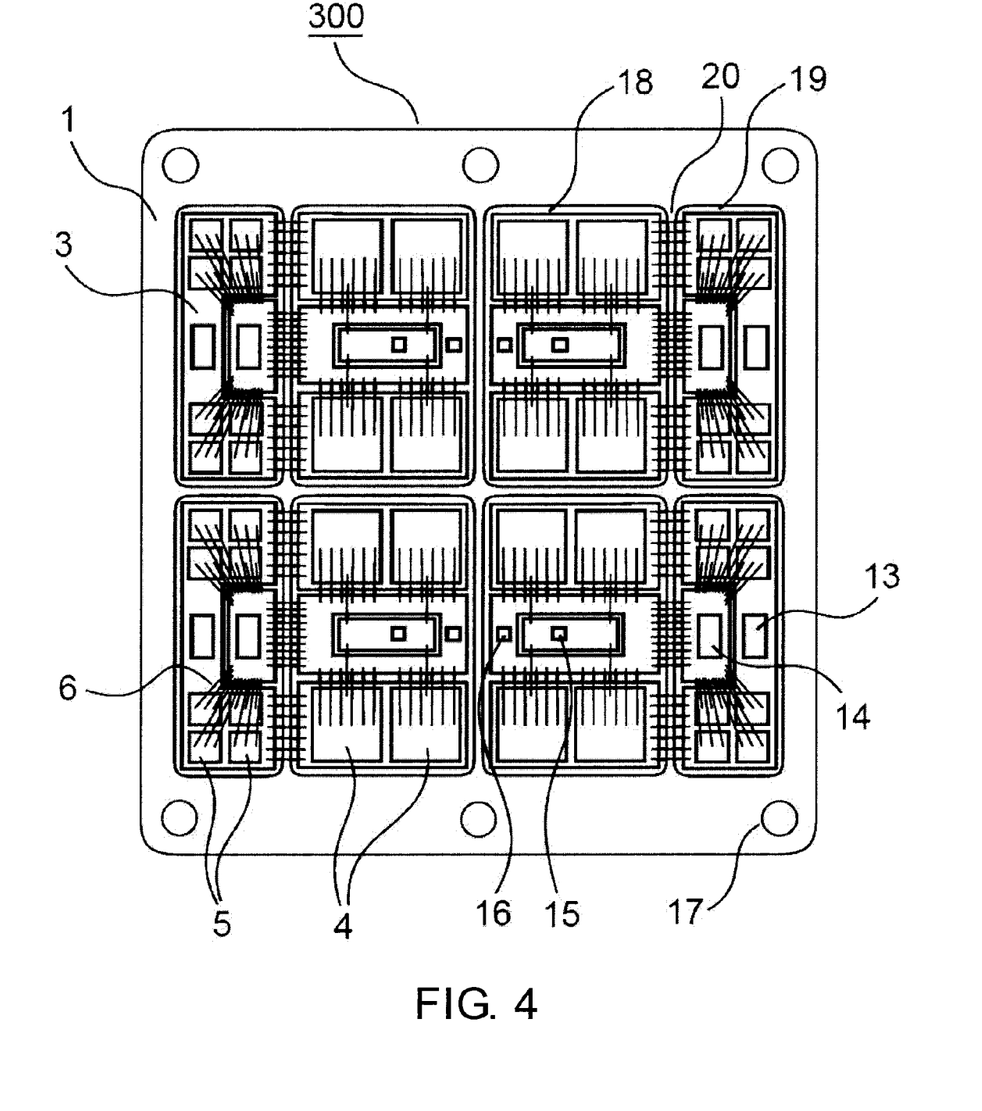
FIG. 4 is a top view showing internal placement of a power semiconductor module according to Embodiment 3 of the present invention.

FIG. 4 is a top view showing internal placement of a power semiconductor module according to Embodiment 3 for embodying this invention. The present figure is a view of the power semiconductor module 300 as viewed from above, with the main electrodes, the control terminals, the housing and the insulative encapsulant materials removed as with FIG. 2. In the present embodiment, the difference between the present embodiment and Embodiment 1 is that the Si switching elements 4 and the SiC diode elements 5 are separately mounted on different electrically insulative substrates 18, 19. The Si switching elements 4 and the SiC diode elements 5 are mounted on the switching element insulative substrate 18 and the diode element insulative substrate 19, respectively. Further, since the switching elements 4 and the diode elements 5 are separately mounted on the different insulative substrates 18, 19, bond wires 20 are additionally provided which electrically connect together conductor patterns of the switching element insulative substrate 18 and those of the diode element insulative substrate 19. Here, even if no bond wires are employed, it will generally suffice if the interconnections are made electrically. For example, the bond wires may be directly connected to the main electrodes 7, 8, or without using the bond wires, bus bars may be employed to provide wiring.

As in the power semiconductor modules in Embodiment 1 and Embodiment 2, when the Si switching elements 4 and the SiC diode elements 5 are mounted on each of one and the same electrically insulative substrates 2, there is high-level thermal interference between the switching elements 4 and the diode elements 5. The present embodiment aims to reduce an influence of such thermal interference, and the switching elements 4 and the diode elements 5 are separately mounted on the different insulative substrates 18, 19. In operation conditions where the switching elements 4 and the diode elements 5 simultaneously generate heat, it is difficult for the switching elements 4 to influence the diode elements 5 by thermal interference, so that the degrees of increases in temperatures of the diode elements 5 can be reduced. Further, when the diode elements 5 are used at high temperatures, an advantageous effect is achieved which reduces the thermal interference with the switching elements 4 from the diode elements 5.

Note that the switching element insulative substrates 18 and the diode element insulative substrates 19 may be of the same material, or when the diode elements 5 are used at high temperatures, such substrates of different materials may be used in consideration of heat-resisting qualities and thermal cycle characteristics of the materials.

Note again that when the SiC switching elements made up of the SiC semiconductors, and the Si diode elements made up of the Si semiconductors are employed to dispose the Si diode elements in the central region of the power semiconductor module and the SiC switching elements in edge regions of the module, the diode elements are mounted on the insulative substrates 18 and the switching elements, on the insulative substrates 19.

As described above, since the Si switching elements 4 and the SiC diode elements 5 are separately mounted on the different electrically insulative substrates 18, 19, it is difficult for the switching elements 4 to influence the diode elements 5 by thermal interference, thereby reducing the degrees of increases in temperatures of the diode elements 5.

Embodiment 4

Figure 5:
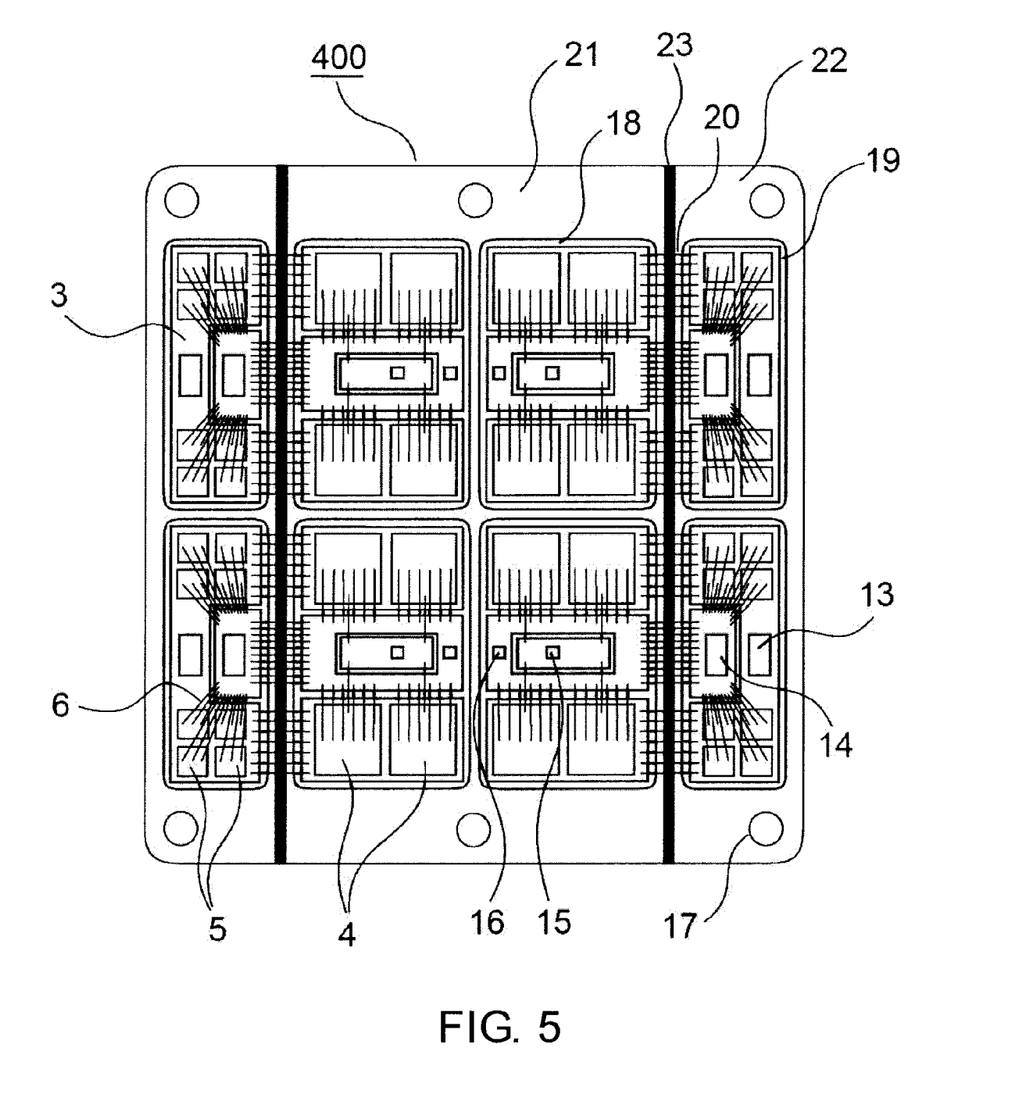
FIG. 5 is a top view showing internal placement of a power semiconductor module according to Embodiment 4 of the present invention.

FIG. 5 is a top view showing internal placement of a power semiconductor module according to Embodiment 4 for embodying this invention. The present figure is a view of the power semiconductor module 400 as viewed from above, with the main electrodes, the control terminals, the housing and the insulative encapsulant materials removed as with FIG. 2. The difference between the present embodiment and Embodiment 3 is that the switching element electrically insulative substrates 18 on which the Si switching elements 4 are mounted and the diode element electrically insulative substrates 19 on which the SiC switching elements 5 are mounted, are separately attached to different baseplates 21, 22. The insulative substrates 18 on which the switching elements 4 are mounted are attached to the baseplate 21, and the insulative substrates 19 on which the switching elements 5 are mounted are attached to the diode element baseplates 22. Referring to FIG. 5, the diode element baseplates 22 are placed on opposite sides relative to the switching element baseplate 21. Heat-insulating material 23 such as resin is used to bridge gaps between the baseplate 21 and each of the baseplates 22. Further, the respective baseplates 21, 22 are provided with the mounting holes 17.

As in the power semiconductor modules in Embodiment 1 through Embodiment 3, when the Si switching elements 4 and the SiC diode elements 5 are mounted above one and the same baseplate 1, there is high-level thermal interference between the switching elements 4 and the diode elements 5. The present embodiment aims to reduce an influence of such thermal interference, and the switching elements 4 and the diode elements 5 are separately mounted on the different insulative substrates 21, 22. In operation conditions where the switching elements 4 and the diode elements 5 simultaneously generate heat, it is difficult for the switching elements 4 to influence the diode elements 5 by thermal interference, so that the degrees of increases in temperatures of the diode elements 5 can be reduced. Further, when the diode elements 5 are used at high temperatures, an advantageous effect is achieved which reduces the thermal interference with the switching elements 4 from the diode elements 5.

Note that when SiC switching elements, made up of SiC semiconductors, and Si diode elements, made up of Si semiconductors, are employed to dispose the diode elements in the central region of a power semiconductor module and the switching elements in edge regions of the module, the diode elements are mounted above the baseplate 21, and the SiC switching elements are mounted above the respective baseplates 22.

As described above, since the Si switching elements 4 and the SiC diode elements 5 are separately mounted above the different baseplates 21, 22, it is difficult for the switching elements 4 to influence the diode elements 5 by thermal interference, thereby reducing the degree of increases in temperatures of the diode elements 5.

Embodiment 5

Figure 6:
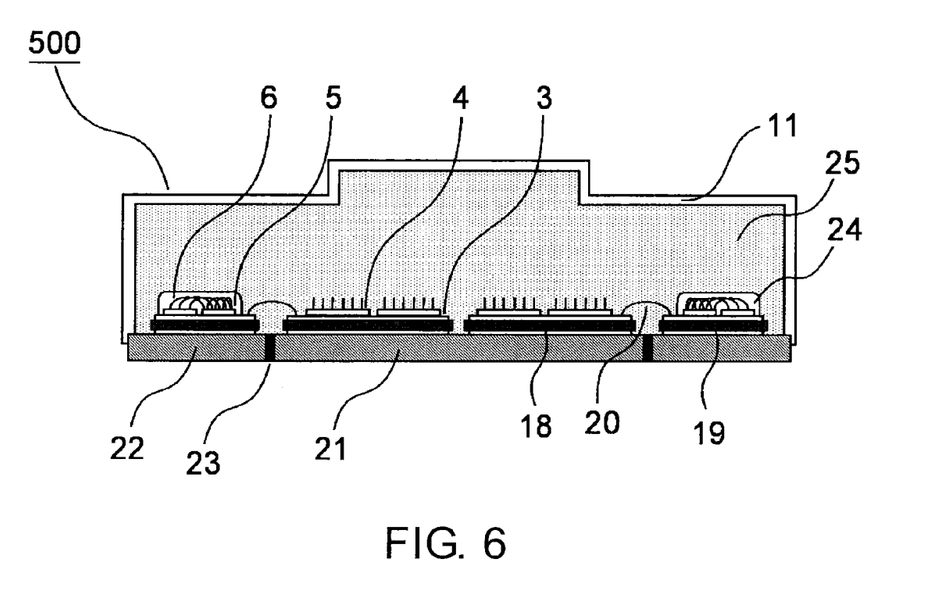
FIG. 6 is a cross-sectional view of a power semiconductor module according to Embodiment 5 of the present invention.

FIG. 5 is a cross-sectional diagram of a power semiconductor module according to Embodiment 5 for embodying the present invention, and is a simplified diagram showing a cross section of the power semiconductor module. In FIG. 6, no main electrodes and control terminals are shown. The difference between a power semiconductor module 500 according to the present embodiment and those according to Embodiment 1 through Embodiment 4 is that the electrically insulative encapsulant material for filling the housing 11 therewith is not limited to a single type, but two types of the materials—a high heat-resistant electrically insulative encapsulant material 24 and a low heat-resistant electrically insulative encapsulant material 25—are employed. The high heat-resistant electrically insulative encapsulant material 24 is employed in the neighborhoods of the SiC diode elements 5, and the low heat-resistant electrically insulative encapsulant material 25, having a low heat-resisting quality as compared to that of the insulative encapsulant material 24, is used at places other than such neighborhoods, such as the neighborhoods of the Si switching elements 4.

Examples of the insulative encapsulant material 24 to be used includes fluorine resin, polyimide, polyamide, epoxy, and further, high heat resistant silicon resin having its heat-resisting quality enhanced by increasing its crosslink density and/or adding a metallic oxide. Silicon gel, silicon rubber or the like is employed as the insulative encapsulant material 25. Preferably, the insulative encapsulant material 24 covers the diode elements 5, and the bond wires 6 that is to be connected to the diode elements 5, and in order to ensure reliability in thermal cycling, preferably the bond wires do not cross between the insulative encapsulant materials 24, 25 of two different types.

In this way, the use of the insulative encapsulant material 24 in the neighborhoods of the diode elements 5 allows the diode elements 5 to be used up to high temperatures. In addition, the insulative encapsulant material 25 is used at places other than the above neighborhoods, such as the neighborhoods of the switching elements 4. Because the insulative encapsulant material 25 is inexpensive when compared to the insulative encapsulant material 24, fabrication costs can be reduced as compared to cases where the insulative encapsulant material 24 alone is used. A high heat-resistant electrically insulative encapsulant material, such as fluorine resin, polyimide or polyamide, is in some cases difficult to form into thick films; however, as in the present embodiment, by making limited use of the insulative encapsulant material 24 so as to cover only the neighborhoods of the diode elements 5, the high heat-resistant electrically insulative encapsulant material can be used which is difficult to form into thick films.

FIG. 6 shows an example in which the Si switching elements 4 and the SiC diode elements 5 are separately mounted above the different baseplates 21, 22 and on the different electrically insulative substrates 18, 19; however, the invention of the present embodiment is also applicable to examples such as situations in which, as in the power semiconductor modules according to Embodiment 1 through Embodiment 3, the switching elements 4 and the diode elements 5 are mounted on each of one and the same electrically insulative substrates 2 attached to one and the same baseplate 1, or in which they are mounted on the different electrically insulative substrates 18, 19, albeit above one and the same baseplate 1.

As described above, the high heat-resistant electrically insulative encapsulant material 24 that covers the regions where the SiC diode elements 5 are placed has a heat-resisting quality higher than the low heat-resistant electrically insulative encapsulant material 25 that covers the regions where the Si switching elements 4 are placed; therefore, the diode elements 5 can be used up to the high temperatures, thus eliminating the need for increasing the number of diode elements 5 paralleled and for reducing the degree of increase of chip's total surface area of the diode elements 5, thereby providing the power semiconductor module 500 capable of being fabricated at low costs.

Note that although all of the embodiments have described examples in which the SiC semiconductors are used as the diode elements, it will generally suffice if, as compared to the Si switching element, the diode element has features such as having lower loss and being capable of being used at high temperatures, and for example, a gallium nitride material or another wide bandgap semiconductor such as of diamond may be used for the diode element.

REFERENCE NUMERAL

1 Baseplate
2 Electrically insulative substrates
3 Conductor patterns
4 Si switching elements
5 SiC diode elements
6, 20 Bond wires
7, 8 Main electrodes
9, 10 Control terminals
11 Housing
12 Electrically insulative encapsulant material
13, 14 Main electrode connecting positions
15, 16 Control terminal connecting positions
17 Mounting holes
18 Switching element electrically insulative substrates
19 Diode element electrically insulative substrates
21 Switching element baseplate
22 Diode element baseplates
23 Heat-insulating material
24 High heat-resistant electrically insulative encapsulant material
25 Low heat-resistant electrically insulative encapsulant material
100, 200, 300, 400, 500 Power semiconductor module

The invention claimed is:

1. A power semiconductor module comprising:
    an insulative substrate;
    a plurality of silicon semiconductor elements located in a first region of the substrate;
    a plurality of wide bandgap semiconductor elements located in a second region of the substrate;
    all of the silicon semiconductor elements being located in the first region;
    the second region containing the entire area of the substrate excluding the first region; and
    the wide bandgap semiconductor elements in the second region being adjacent to two adjoining sides of the first region.

2. The power semiconductor module of claim 1, comprising:
    a plurality of insulative substrates each having first and second regions;
    a plurality of silicon semiconductor elements located in a first region of each the substrates;
    a plurality of wide bandgap semiconductor elements located in a second region of each of the substrates;
    all of the silicon semiconductor elements for a corresponding one of the insulative substrates being located in a respective one of the first regions;
    each second region containing the entire area of a corresponding substrate excluding a corresponding first region; and
    the wide bandgap semiconductor elements in each second region being adjacent to two adjoining sides of the corresponding first region.

3. The power semiconductor module of claim 2, comprising:
    the plurality of insulative substrates being arranged such the wide bandgap semiconductor elements in the second regions surround the silicon semiconductor elements in the first regions.

4. The power semiconductor module of claim 2, comprising:
    the wide bandgap semiconductor elements in the second regions being disposed between the first regions and each of two adjoining outer edges of the insulative substrates.

5. The power semiconductor module of claim 1, comprising:
the wide bandgap semiconductor elements in the second region being disposed between the first region and each of two adjoining outer edges of the insulative substrate.

6. The power semiconductor module according to claim 1, wherein the number of the wide bandgap semiconductor elements is larger than that of the Si semiconductor elements.

7. The power semiconductor module according to claim 1, wherein
the Si semiconductor elements are switching elements; and
the wide bandgap semiconductor elements are diode elements.

8. The power semiconductor module according to claim 1, wherein,
the Si semiconductor elements are diode elements; and
the wide bandgap semiconductor elements are switching elements.

9. A power semiconductor module comprising:
a plurality of silicon (Si) semiconductor elements, the Si semiconductor elements placed in a first region which is a central region of the power semiconductor module; and
a plurality of wide bandgap semiconductor elements, the wide bandgap semiconductor elements placed in a second region which is a region other than the first region;
wherein the wide bandgap semiconductor elements surround all sides of the Si semiconductor elements.

10. The power semiconductor module according to claim 9, further comprising an insulating substrate where both of the Si semiconductor elements and the wide bandgap elements are located.

11. The power semiconductor module according to claim 9, wherein a number of the wide bandgap semiconductor elements is larger than that of the Si semiconductor elements.

12. The power semiconductor module according to claim 9, wherein
the Si semiconductor elements are switching elements; and
the wide bandgap semiconductor elements are diode elements.

13. The power semiconductor module according to claim 9, wherein
the Si semiconductor elements are diode elements; and
the wide bandgap semiconductor elements are switching elements.

14. A power semiconductor module comprising:
a plurality of insulating substrates;
a plurality of silicon (Si) semiconductor elements disposed on each of the substrates; and
a plurality of wide bandgap semiconductor elements disposed on one side of each of the substrates; wherein
the plurality of substrates are arranged such that the Si semiconductor elements are disposed between the wide bandgap semiconductor elements.

15. The power semiconductor module according to claim 14, wherein a number of the wide bandgap semiconductor elements is larger than that of the Si semiconductor elements.

16. The power semiconductor module according to claim 14, wherein
the Si semiconductor elements are switching elements; and
the wide bandgap semiconductor elements are diode elements.

17. The power semiconductor module according to claim 14, wherein
the Si semiconductor elements are diode elements; and
the wide bandgap semiconductor elements are switching elements.

18. The power semiconductor module of claim 14, wherein
the insulating substrates on which the Si semiconductor elements and the wide band gap semiconductor elements are mounted are placed on one and the same baseplate.

19. The power semiconductor module of claim 14, wherein
the wide band gap semiconductor elements are disposed in an L-character shape on the each of the insulating substrates.

20. The power semiconductor module of claim 14, wherein
the plurality of wide band gap semiconductor elements are disposed on two sides of each of the substrates and;
the plurality of substrates are arranged to make the wide bandgap semiconductor elements surround the Si semiconductor elements.

* * * * *